(12) United States Patent
Chey et al.

(10) Patent No.: US 9,335,346 B2
(45) Date of Patent: May 10, 2016

(54) HIGH PERFORMANCE COMPLIANT WAFER TEST PROBE

(75) Inventors: S. Jay Chey, Hartsdale, NY (US); Dustin M. Fregeau, South Burlington, VT (US); Donna S. Zupanski-Nielsen, Yorktown Heights, NY (US); Aparna Prabhakar, North White Plains, NY (US); Pavan Samudrala, White Plains, NY (US); Mohammed S. Shaikh, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 412 days.

(21) Appl. No.: 13/608,706

(22) Filed: Sep. 10, 2012

(65) Prior Publication Data

US 2012/0329295 A1   Dec. 27, 2012

Related U.S. Application Data

(62) Division of application No. 12/771,697, filed on Apr. 30, 2010, now Pat. No. 8,487,304.

(51) Int. Cl.
*H01L 23/48* (2006.01)
*H01L 23/52* (2006.01)
(Continued)

(52) U.S. Cl.
CPC ........ *G01R 1/06716* (2013.01); *G01R 1/06733* (2013.01); *G01R 1/06755* (2013.01)

(58) Field of Classification Search
USPC ......... 257/499, 734, 738, 741, 750, 751, 758, 257/773, 774, 775, 778, 781, E21.309, 257/E21.508, E23.021, E23.024, E23.025, 257/E23.073, E25.011, E25.029; 438/113, 438/460, 612–615, 652, 653, 656, 629, 438/784; 228/180.22, 246
See application file for complete search history.

(56) References Cited

U.S. PATENT DOCUMENTS 5,977,632 A * 11/1999 Beddingfield ................ 257/737
6,437,584 B1   8/2002 Gleason et al.
(Continued)

FOREIGN PATENT DOCUMENTS

DE       3520520 A1 * 12/1986

OTHER PUBLICATIONS

Bakr et al., Sea of Leads (SoL) Ultrahigh Density Wafer-Level Chip Input/Output Interconnections for Gigascale Integration (GSI), IEEE Transactions on Electron Devices. vol. 50, No. 10. Oct. 2003, pp. 2035-2046.
(Continued)

*Primary Examiner* — Meiya Li
(74) *Attorney, Agent, or Firm* — Scully Scott Murphy and Presser; Frank Digiglio

(57) ABSTRACT

An electrical connection includes a first electrical contact made of electrically conductive material. The first electrical contact is formed with a depression therein. Also included are a deformable pad, having a Young's modulus of less than 1,000,000 psi, which bears on the first contact; and a second electrical contact, made of electrically conductive material, which contacts the first electrical contact and is at least partially received into the depression. The deformable pad at least partially causes at least one lateral force on the first electrical contact, so as to induce the first electrical contact to make an electrical connection with the second electrical contact. An array of such contacts is also contemplated, as is an array of cantilevered contacts, which may or may not have depressions, and which are supported by at least one elastomeric pad, having a Young's modulus of less 72,500 psi.

20 Claims, 15 Drawing Sheets

(51) Int. Cl.
*H01L 29/40* (2006.01)
*G01R 1/067* (2006.01)

(56) References Cited

U.S. PATENT DOCUMENTS 7,368,927 B2   5/2008   Smith et al.
2008/0227240 A1*  9/2008   Sharma et al. ................ 438/113

2009/0152741 A1*  6/2009   Chang .................. G02B 6/4214
                                                                    257/778

OTHER PUBLICATIONS

Thacker et al., Compliant Probe Substrates for Testing High Pin-Count Chip Scale Packages, pp. 1-6.
Dana et al, Sea-of-Leads MEMS I/O Interconnects for Low-k IC Packaging, Journal of Microelectromechanical Systems, vol. 15, No. 3, Jun. 2006, pp. 523-530.

* cited by examiner

US 9,335,346 B2

HIGH PERFORMANCE COMPLIANT WAFER TEST PROBE

CROSS-REFERENCE TO RELATED APPLICATIONS

This application is a divisional of U.S. patent application Ser. No. 12/771,697, filed Apr. 30, 2010, now U.S. Pat. No. 8,487,304, which is incorporated by reference herein.

FIELD OF THE INVENTION

The present invention generally relates to the electrical and electronic arts and, more particularly, to electrical contacts, such as small electrical contacts for small circuit components, particularly semiconductor chips.

BACKGROUND OF THE INVENTION

Currently, high performance Controlled Collapse Chip Connection (C4) chips are tested at the wafer level using TFI (thin film interposer) probes. These probes are rigid.

The C4 height within a chip typically varies by approximately 0 to 40 microns. In order to contact all the C4s, it is necessary to apply considerable force to deform the solder bumps.

FIG. 1 shows an exemplary prior art TFI approach. A printed circuit board (PCB) 102 used for test purposes is interconnected with C4 contacts 112 on a chip site of a wafer 114 using an MLC (multi-layer ceramic) space transformer 104, pedestal 108, mounting disk 106, and IPP (interface pellicle probe) 110. The mounting fixture is omitted for clarity and brevity.

SUMMARY OF THE INVENTION

Principles of the present invention provide techniques for high performance compliant wafer test probes. In one aspect, an exemplary electrical connection includes a first electrical contact made of electrically conductive material. The first electrical contact is formed with a depression therein. Also included are a deformable pad, having a Young's modulus of less than 1,000,000 psi, which bears on the first contact; and a second electrical contact, made of electrically conductive material, which contacts the first electrical contact and is at least partially received into the depression. The deformable pad at least partially causes at least one lateral force on the first electrical contact, so as to induce the first electrical contact to make an electrical connection with the second electrical contact.

In another aspect, an array of such connections, having a suitable pitch between connections, is provided for use in a variety of applications.

In still another aspect, an array of electrical connections includes a first pattern array having a plurality of first electrical contacts made of electrically conductive material. The first electrical contacts comprise cantilevers. Also included in the first pattern array is at least one elastomeric pad, having a Young's modulus of less 72,500 psi, which supports the plurality of first contacts. A second pattern array includes a plurality of second electrical contacts, made of electrically conductive material, which contact corresponding ones of the first electrical contacts. A pitch exists between any two of the connections in the array.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

As noted, currently, high performance Controlled Collapse Chip Connection (C4) chips are tested at the wafer level using TFI (thin film interposer) probes. These probes are rigid. The C4 height within a chip typically varies by approximately 0 to 40 microns. In order to contact all the C4s, it is necessary to apply considerable force to deform the solder bumps.

One or more embodiments of the invention advantageously provide a compliant probe able to contact shorter bumps without deforming the taller bumps. One or more embodiments provide one or more of the following features and advantages:

a) Compliant probe structure to compensate for lack of C4 co-planarity, with spring force to maintain contact, allowing contact with shorter as well as taller bumps easily at the same time.

b) Compliant TFI deposited on silicon "chicklet" pads with through-silicon vias (TSV); quite cost effective and will allow thin film interposers and substrate to be a single unit.

c) Can be deposited on substrate to be used for wafer test; potentially can be used for chip characterization or chip burn-in.

d) No separate TFI required, resulting in significant cost savings.

e) Compliant probes expand to contact non co-planar C4:
   a. No additional force for lead free C4 harder material.
   b. Less force per C4.
   c. Less vertical force, thus good for more fragile chip materials.

f) CTFI (compliant thin film interface)/substrate unit cost significantly less than current techniques.

g) Processes applicable to organic pedestal and 3D work.

One or more embodiments advantageously reduce the chuck force required to contact the entire chip bump array, reduce the total force on the chip (likely to otherwise continue to increase as number of bumps increases), and reduce or eliminate potential for internal damage to chip during wafer test (by reducing force on the chip). This latter aspect is believed to be particularly significant for new dielectric materials, air gap technology, lead free C4, and the like.

Figure 2:
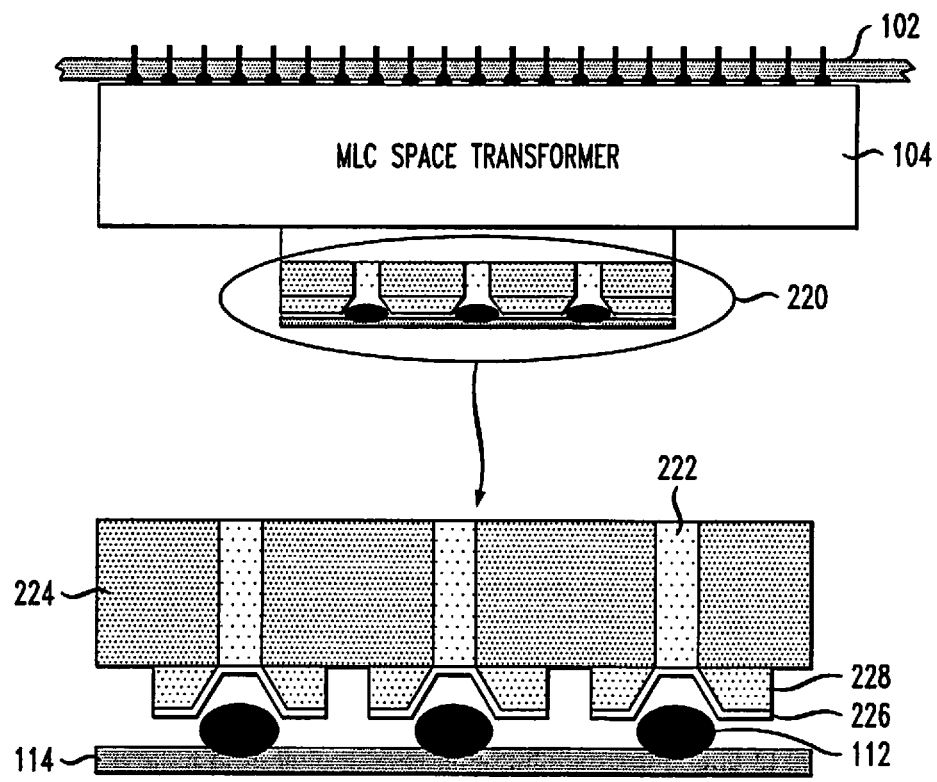
FIG. 2 depicts a compliant thin film interposer probe in accordance with an aspect of the invention.

In one or more embodiments, the Chip C4 contacts a conducting pad on a transformer (device to transition the contacts on the chip to the contacts on the test equipment) that is either on top of an elastomer or on conductive sides of a truncated elastomeric cone and rim connected to the transformer pad, thus forming a compliant probe. As shown in FIG. 2, MLC space transformer 104 interfaces with PCB 102. Thin film interposer probes are provided as shown at 220. Details of same are depicted in the lower left hand corner of the figure. The chip site on the wafer is shown at 114 and the chip C4 at 112. The exemplary inventive structure includes silicon portion 224 with conductive epoxy vias 222. The elastomer is shown at 228. The metallic conductive sides of the truncated elastomeric cone are seen at 226, as is their contact with C4 bumps 112. Note that the compliant thin film interposer (CTFI) may be deposited directly on a substrate or may be provided on a through-silicon via (TSV) chip attached to a substrate.

The skilled artisan will, given the teachings herein, be able to construct and use structures as depicted herein; nevertheless, out of an abundance of caution, the complete disclosure of co-assigned U.S. patent application Ser. No. 12/540,487 of inventors Shaikh, Tsang, Chey, Krywanczyk, and Tiersch, entitled Silicon Chiclet Pedestal, filed Aug. 13, 2009, is expressly incorporated herein by reference in its entirety for all purposes.

Figure 3:
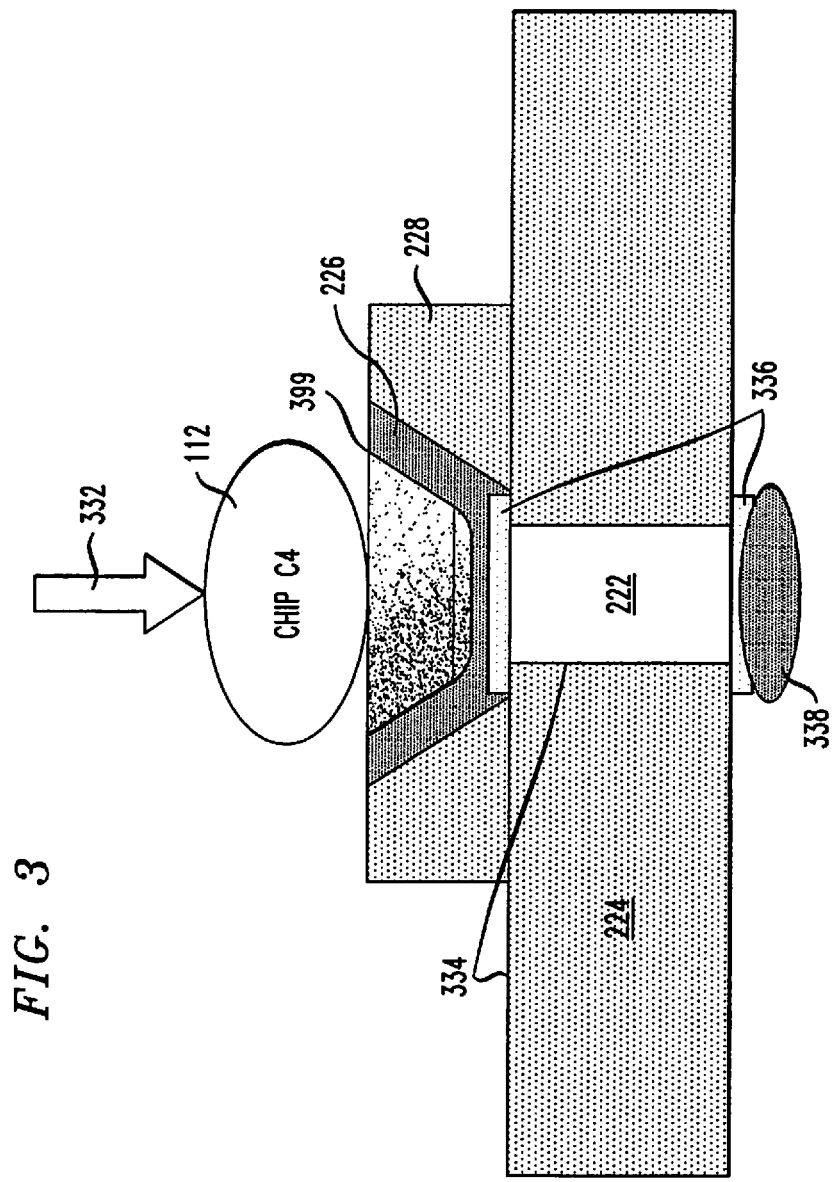
FIG. 3 depicts an exemplary contact in accordance with an aspect of the invention.

Additional details are shown in FIG. 3. A truncated elastomeric cone 228 is built on each of the foot print pads on a transformer. The cone inside and rim are plated, as shown at 226, to make an electrical connection between the pad (ball-limiting metallurgy or BLM) 336 on the cone base to the cone side walls and rim. A rough plated surface is preferably created either by a suitable plating technique or by embedding sharp conductive or non-conductive particles in the elastomer 228 and plating over same. These particles will help break the C4 oxide layer, in order to help obtain good electrical contact. The opening in the cone (upper portion of the plated elastomeric cone 228) is smaller than the diameter of C4 112. During test the C4 112 will sit inside the opening. As the chip C4 pushes into the hole, the elastomer 228 moves in both the radial and Z directions. In a preferred approach, as discussed further below, there will be vertical slits in the plating to prevent the plating from tearing and to let the elastomer move freely.

Note the applied probing force 332, silicon "chicklet" 224, solder ball 338 for substrate attachment with its own BLM pad 336, and via 222 with plated copper walls and filled with silver epoxy. Note also thermal oxide layers 334.

FIG. 3 thus depicts a side view of the truncated elastomer, which displays how the C4 sits inside the opening.

This approach reduces or preferably eliminates the need of deforming the taller bumps in order to contact the shorter bumps; in addition, the vertical force component on C4 is reduced.

Figure 4:
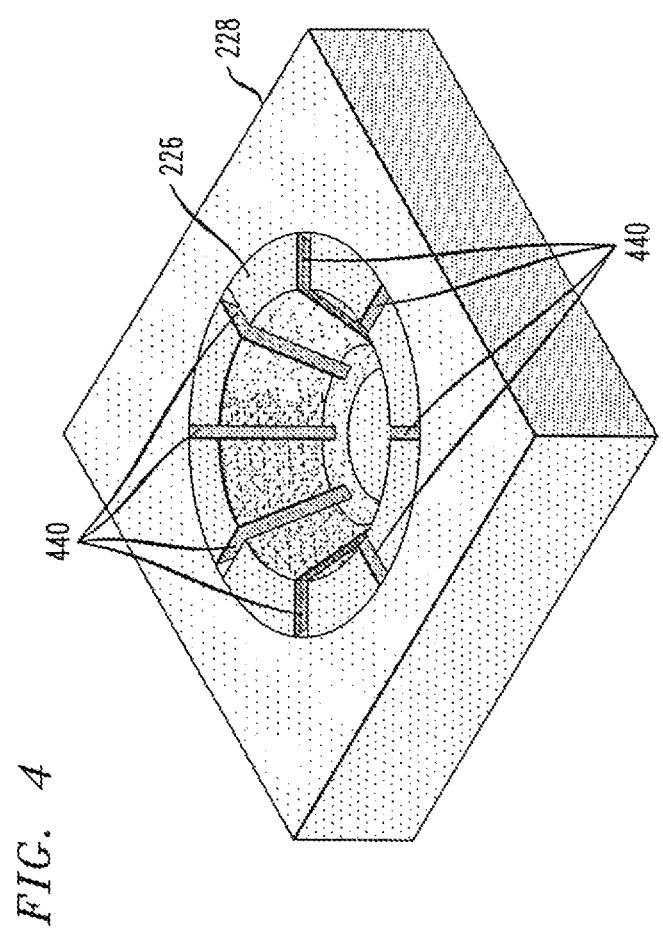
FIG. 4 depicts exemplary details of an exemplary contact in accordance with an aspect of the invention.

FIG. 4 provides further non-limiting exemplary details of the truncated elastomeric cone, to reduce or eliminate the vertical force component. An elastomeric bump 228 is built on each of the foot print bumps on the transformer, and the top and side walls are plated as at 226. The plating is connected to the foot print bump. Vertical slits 440 are provided on the bump side walls to make it more flexible. A rough surface will preferably be created either by plating techniques or by embedding sharp conductive or non conductive particles into the elastomer 228. In this case, when a relatively tall chip C4 bump contacts the probe pad, deflection of the probe pad will reduce the force required to make contact to the shorter bumps. Furthermore, the slits 440 form "petals" there-between and the same can flex to tolerate misalignment between the plating and the C4.

Figure 5:
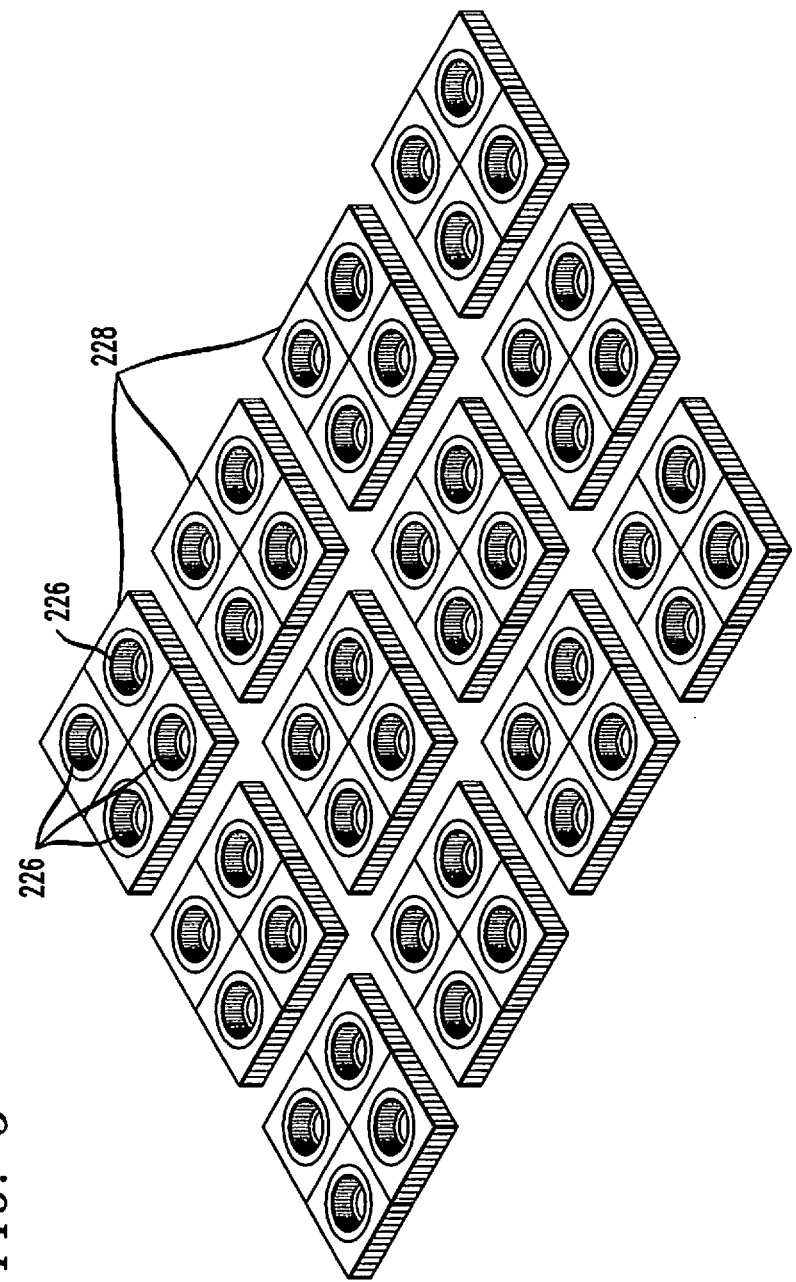
FIG. 5 depicts an exemplary pad layout in accordance with an aspect of the invention.

FIG. 5 presents a non-limiting exemplary pad layout, wherein the structures depicted in FIG. 4 are arranged in two-by-two groups of four, and then in evenly spaced rows and columns.

Figure 6:
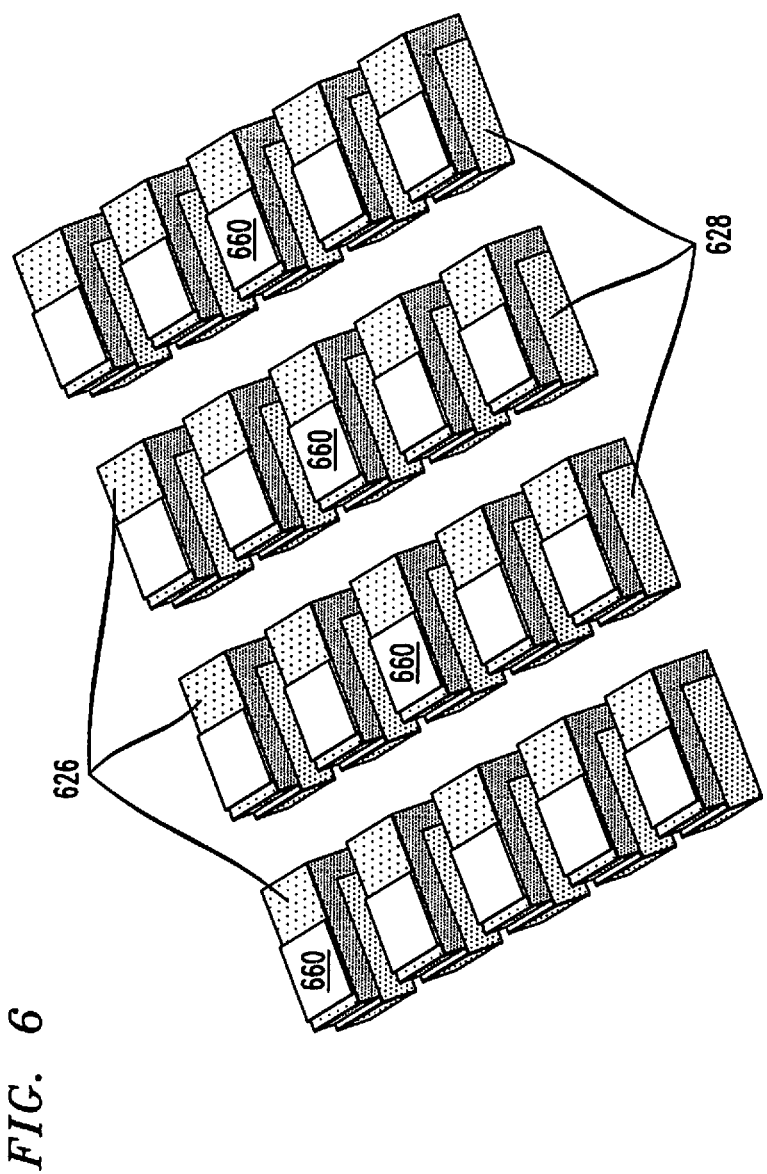
FIG. 6 depicts another exemplary pad layout in accordance with an aspect of the invention.

FIG. 6 depicts an alternative embodiment wherein an elastomeric bump 628 is built close to each foot print pad on the transformer. The elastomeric pad side wall close to or on top of the transformer pad, and the top surface, are plated as shown at 626, creating an electrical path from the transformer pad to the elastomeric pad top surface. A TFI-like pad or rough surface is created on top, as shown at 660, using techniques similar to those discussed above. Since there is no plating on three sides of the elastomeric pad 628, significant deflection is attainable. Plating 626 is preferably selected for structural reasons; for example, to be able to tolerate bending-induced stress and/or deformation without fatigue failure (e.g., copper). Pad 660 is preferably selected for purposes of providing low electrical contact resistance (soft and highly conductive, such as gold).

Figure 7:
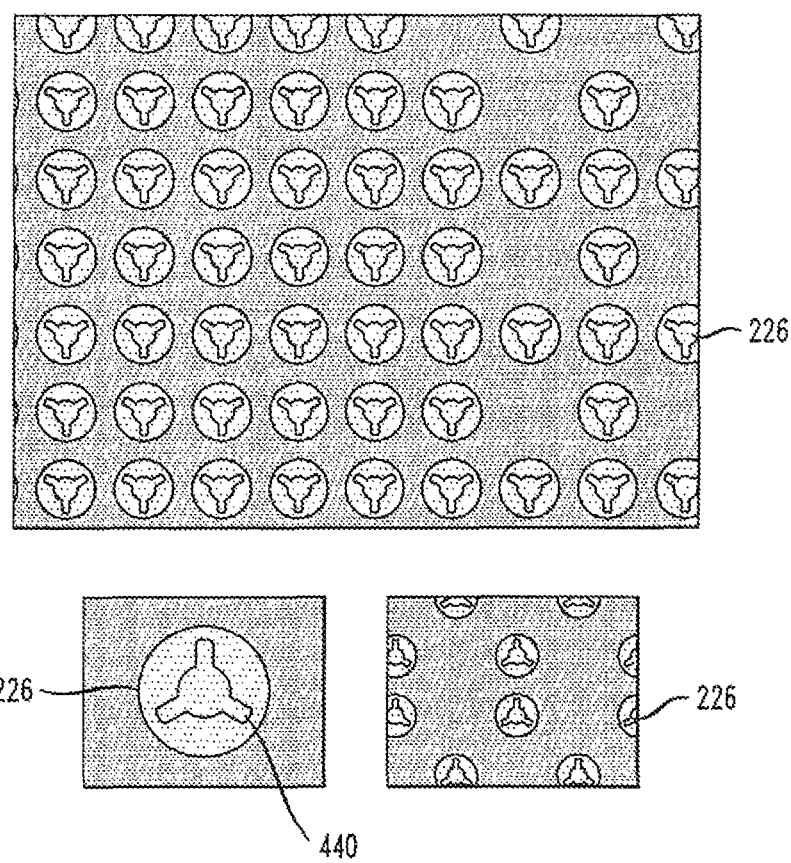
FIG. 7 depicts exemplary contacts in accordance with an aspect of the invention.

FIG. 7 depicts photomicrographs of varying degrees of enlargement, including contacts 226 with slits 440. A 27 mm by 22 mm footprint at 186 micron pitch with 9200 pads was employed. For experimental purposes, prototype devices were constructed and tested by probe cycle contacts and compressions for up to 27,000 cycles, with no cracking or damage to the metal structure (ring 226). The smallest inner diameter was 50 microns on a 185 micron pitch. The standard probe travel is 300 microns, while with the tested embodiment of the compliant probes it was reduce by ½ to 150 microns, and no vertical deformation of the C4 was required. The tested embodiment worked as expected and thermal and mechanical functionality was verified.

Figure 8:
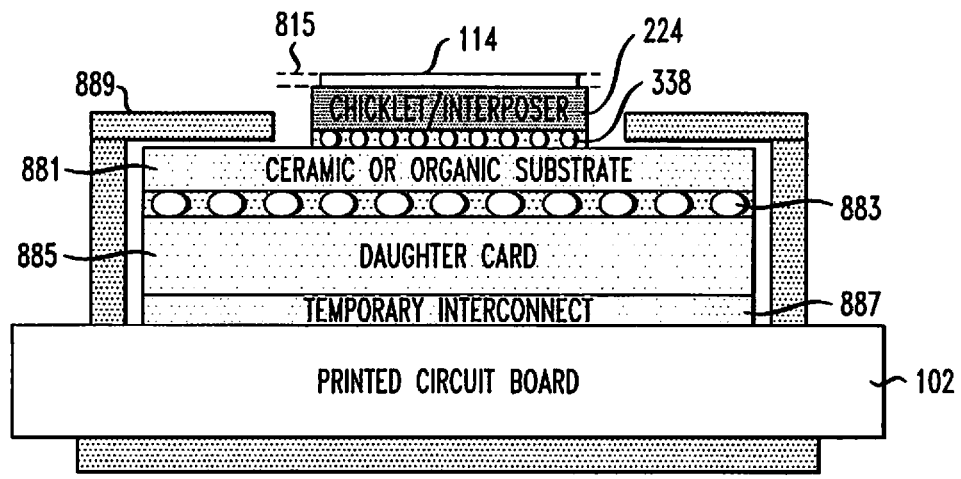
FIG. 8 depicts an exemplary assembly concept in accordance with an aspect of the invention.
Figure 9:
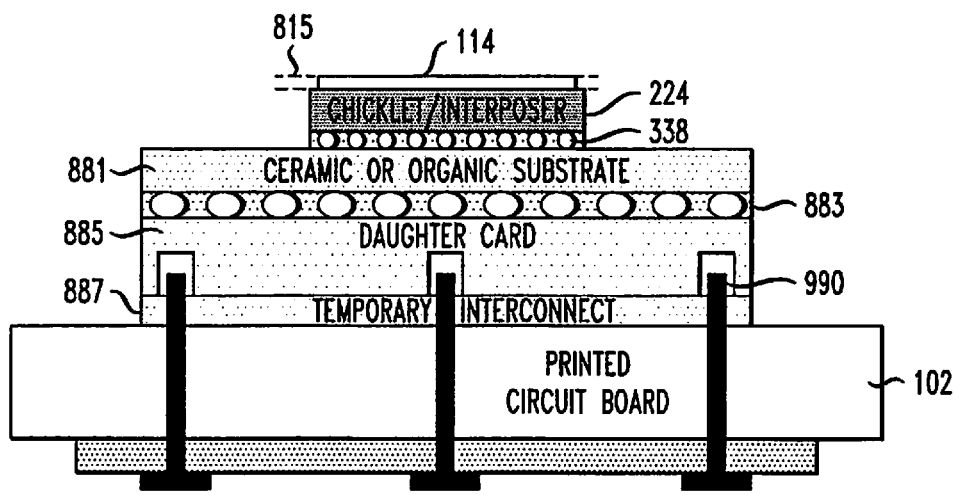
FIG. 9 depicts another exemplary assembly concept in accordance with an aspect of the invention.

FIGS. 8 and 9 present two non-limiting exemplary assembly techniques, for the final integration with the CTFI. In FIG. 8, note PCB 102 and clamp structure 889 for securing purposes. A chip footprint 114 on a wafer 815 (shown in dashed line) is tested. "Chicklet" 224 is provided with solder joint (balls) 338 for contact with ceramic or organic substrate 881, which in turn has solder joint (balls) 883 for contact with daughter card 885. Both solder regions 338, 883 may be provided with under fill, not separately numbered. Temporary interconnect 887 is provided between daughter card 885 and PCB 102. Elements 226, 228 on the top of "chicklet" 224, and the corresponding contacts on the chip, are omitted due to the scale of the figures. Due care should be taken in use of the embodiment of FIG. 8, to address any footprint bowing concerns.

In FIG. 9, note PCB 102 secured to daughter card 885 with bolts and PEM® brand nuts in the daughter card. A chip footprint 114 on as wafer is tested. "Chicklet" 224 is provided with solder joint (balls) 338 for contact with ceramic or organic substrate 881, which in turn has solder joint (balls) 883 for contact with daughter card 885. Both solder regions 338, 883 may be provided with under fill, not separately numbered. Temporary interconnect 887 is provided, between daughter card 885 and PCB 102.

Figure 10:
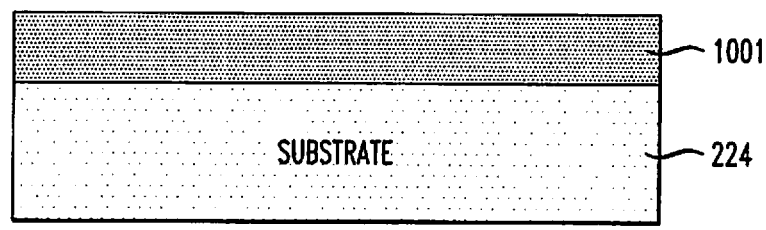
FIGS. 10-15 show exemplary fabrication steps in accordance with an aspect of the invention.
Figure 11:
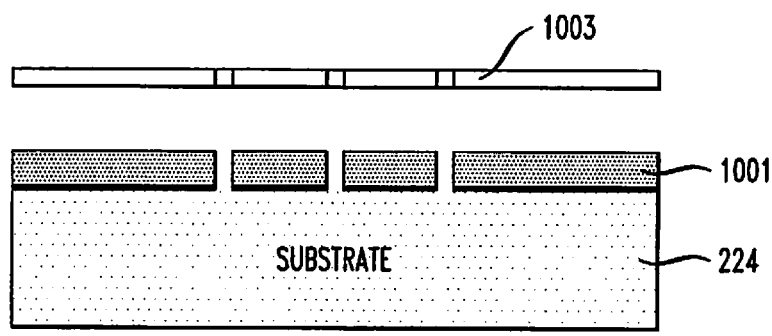
Figure 12:
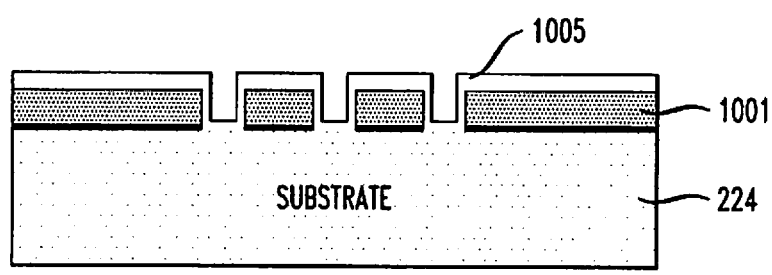
Figure 13:
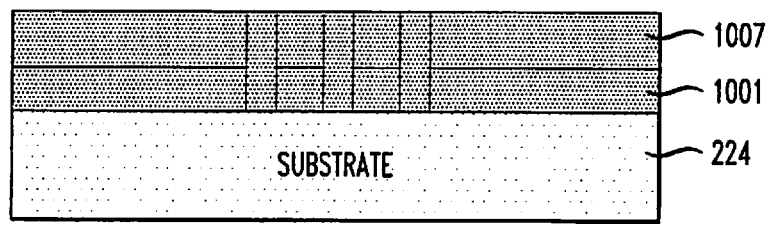
Figure 14:
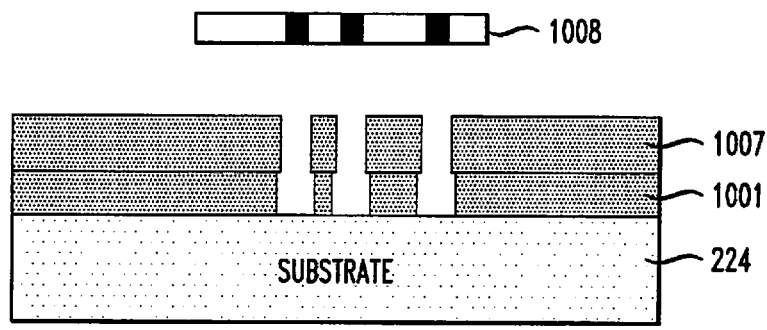
Figure 15:
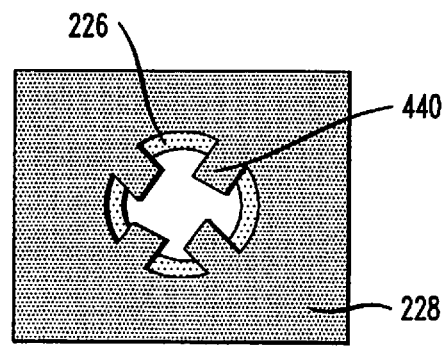

FIGS. 10-15 show exemplary fabrication steps in accordance with an aspect of the invention. In FIG. 10, a silicone-based resist 1001 with a coefficient of thermal expansion (CTE) of less than 300 ppm/° C. (parts per million per degree Centigrade) (more preferably less than 200 and most preferably less than 70) and a low modulus is deposited on cleaned Si wafer (substrate) 224. In FIG. 11, the resist 1001 is patterned and developed; development may be effectuated by cycles of ultrasonication and spray techniques, as seen at 1003. FIG. 12 depicts metal stack deposition (for example, using evaporation), as shown at 1005. In FIG. 13, resist is spun on the top surface for patterning, as shown at 1007. FIG. 14 depicts the resultant structure after top resist development. Note photo mask 1008 (which could be, for example, a shadow mask if laser ablation was employed). FIG. 15 presents a top view of an individual structure after plating and top resist removal; note the elastomer 228, plating 226, and slits 440. Elastomer 228 is the material 1001 after being processed through a curing cycle after FIG. 11.

In one or more embodiments, the resist thickness is from 50 to 70 microns. In one or more embodiments, a suitable resist is Avatrel® photoresist manufactured by Promerus Subsidiary of Sumitomo Bakelite Co. Ltd., Brecksville, Ohio, USA. In one or more embodiments, surface treatment can be effectuated using standard clean, ion beam etch and RIE (reactive ion etch) processes. The elastomer lithography can include, for example, resist spin of the Avatrel® material, soft bake, exposure, post exposure bake, develop, and descum operations. In some instances, curing can be carried out for 30 minutes at 200° C. in a suitable oven; for example, a Heraeus oven, available from Heraeus Holding GmbH, Hanau, Germany. Seed layer deposition can be carried out, for example, via Ti/Cu magnetron deposition. Plating lithography can be carried out, for example, via JSR THB126N (a negative photoresist available from JSR Corporation, Sunnyvale, Calif., USA) resist spin, soft bake, exposure, develop, and descum processes. Suitable plating techniques include Ni/Au plating, coarse plating to help break C4 oxidation layer, and/or embedded particles to help break the C4 oxidation layer. Resist strip and seed layer etch can be carried out, for example, using JSR THBS2 (available from JSR Corporation, Sunnyvale, Calif., USA), peroxide based copper etchant, and 1:100 hydrofluoric acid for Ti etch.

In some instances, material 1001 is Unity 4678E with a Young's modulus of 0.5 GPa available from Promerus. Other versions are available with a Young's modulus of 1.8 GPA. The glass transition temperature $G_T$ can be about 220 degrees C., with a decomposition temperature of about 425 degrees C.

Figure 16:
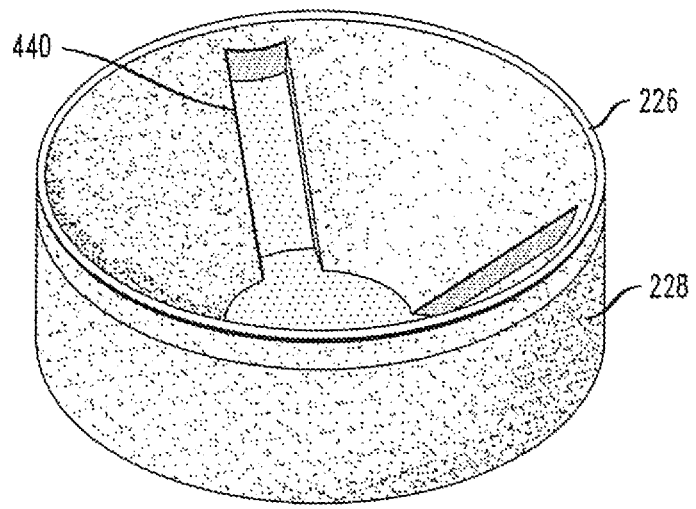
FIGS. 16-18 are, respectively, isometric, sectional, and top views of an exemplary contact in accordance with an aspect of the invention.
Figure 17:
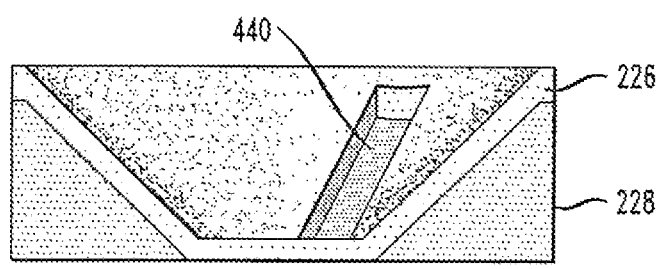
Figure 18:
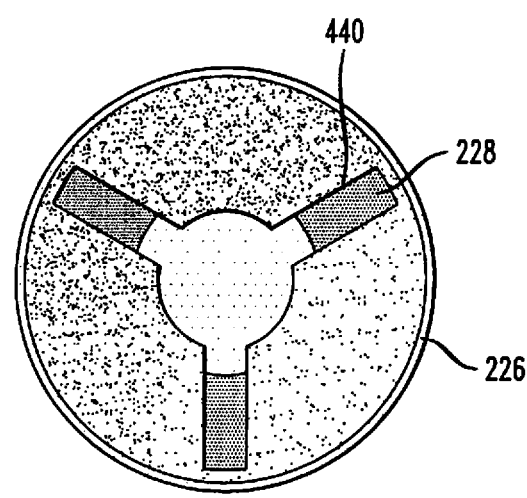

FIGS. 16-18 are, respectively, isometric, sectional, and top views of an exemplary contact in accordance with an aspect of the invention. The contact is a truncated cone with 45 degree side walls. Note elastomer 228, plating 226, and slits 440.

Figure 19:
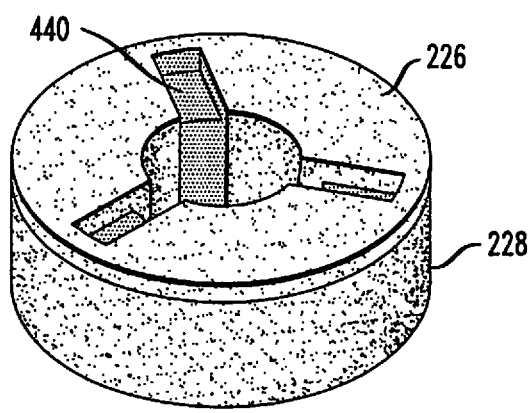
FIGS. 19-21 are, respectively, isometric, sectional, and top views of another exemplary contact in accordance with an aspect of the invention.
Figure 20:
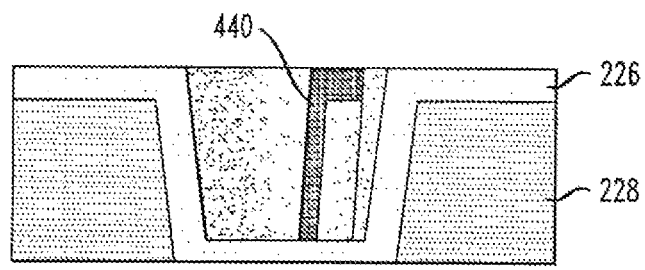
Figure 21:
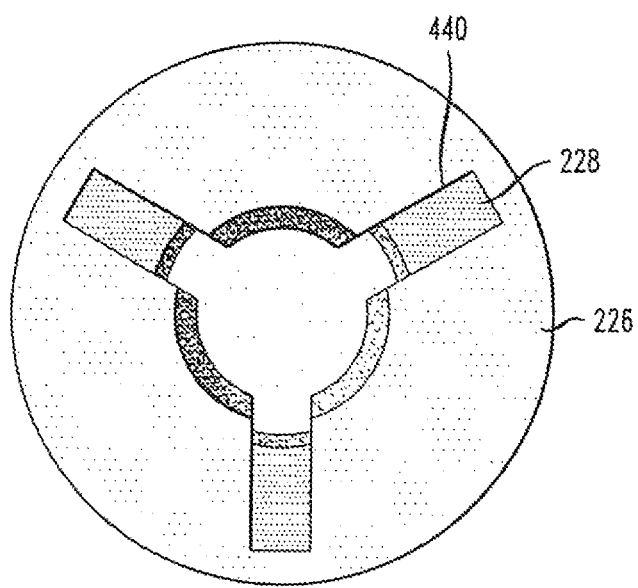

FIGS. 19-21 are, respectively, isometric, sectional, and top views of another exemplary contact in accordance with an aspect of the invention. The contact is a truncated cone with almost vertical side walls, approaching a cylinder. Note elastomer 228, plating 226, and slits 440.

Given the discussion thus far, it will be appreciated that, in general terms, an exemplary electrical connection, according to an aspect of the invention, includes a first electrical contact made of electrically conductive material 226 and having a depression (e.g., truncated cone as in FIGS. 16-18 or cylinder or near-vertical side wall truncated cone as in FIGS. 19-21). The connection further includes a pad 228 made of a deformable material having a Young's modulus of less than 1,000, 000 psi (pounds force per square inch). The pad bears on the first contact. The connection still further includes a second electrical contact such as 112, made of electrically conductive material, which contacts the first contact and is at least partially received into the depression. The pad at least partially causes one or more lateral forces on the first electrical contact, so as to induce the first electrical contact to make an electrical connection with the second electrical contact.

Various exemplary values for the upper value of Young's modulus for the pad material, which may be employed in one or more embodiments, are listed in the table below in Si units and PSI. Note that in a preferred but non-limiting approach, the pad is an elastomeric pad. In another aspect, the pad may be made from polyimide material or a material structurally similar to polyimide.

| | |
|---|---|
| 6.9 GPa | 1,000,000 psi |
| 5.5 GPa | 800,000 psi |
| 2.0 GPa | 290,000 psi |
| 1.8 GPa | 261,000 psi |
| 0.5 GPa | 72,500 psi |
| 21 MPa | 3,000 psi |
| 6.9 MPa | 1,000 psi |

Figure 22:
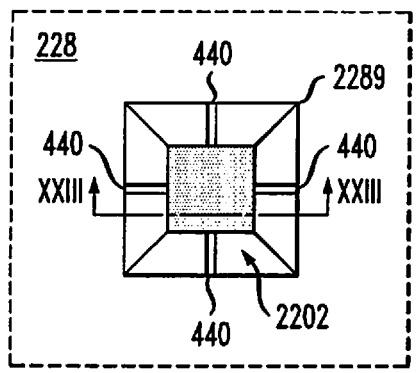
FIGS. 22-29 depict various configurations of contact depressions in accordance with an aspect of the invention.
Figure 24:
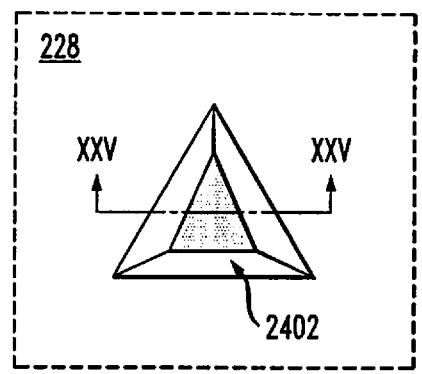
Figure 23:
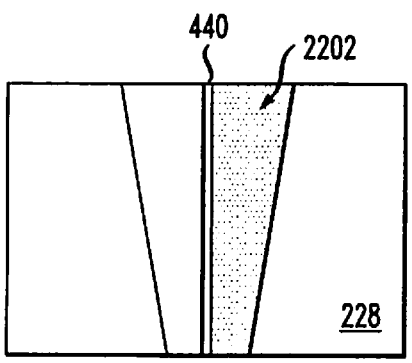
Figure 25:
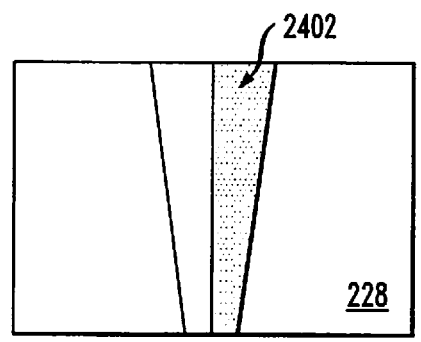
Figure 26:
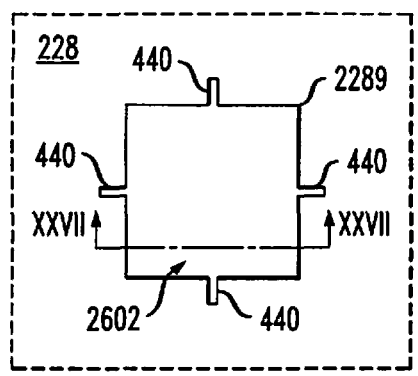
Figure 28:
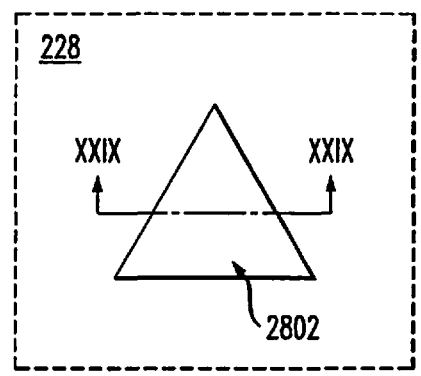
Figure 27:
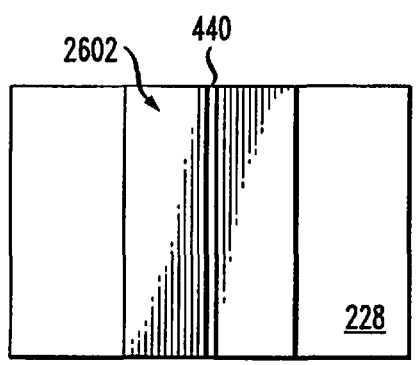
Figure 29:
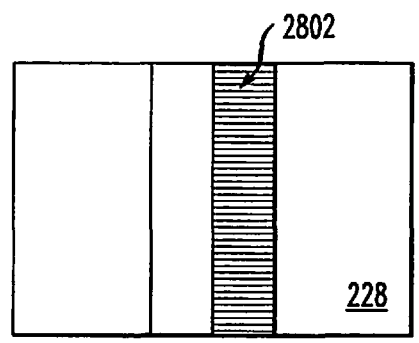

While non-limiting examples have been given with regard to the depression, including truncated cone with 45 degree side walls as in FIGS. 16-18 or cylinder or near-vertical side wall truncated cone as in FIGS. 19-21, these examples are non-limiting. A variety of different angles may be used for truncated cone depressions. In some instances, these can range from the vertical or nearly vertical to about 45 degrees. However, a wide variety of cross sections could be employed, and the same could have vertical or near-vertical side walls, or could have tapered side walls. For example, a variety of polygonal cross sections could be employed, such as square or triangular. Where tapered, these could form pyramidal shapes. Non-circular non-polygonal cross sections could also be used, e.g., elliptical or oblong, again, with vertical or near-vertical, or tapered sides. FIGS. 22 and 23 show top and cross-sectional views of a depression 2202 which is square in cross section and with tapered sides. FIGS. 24 and 25 show top and cross-sectional views of a depression 2402 which is triangular in cross section and with tapered sides. Section lining is omitted to avoid clutter. FIGS. 26 and 27 show top and cross-sectional views of a depression 2602 which is square in cross section and with vertical or near-vertical sides. FIGS. 28 and 29 show top and cross-sectional views of a depression 2802 which is triangular in cross section and with vertical or near-vertical sides. Section lining is omitted to avoid clutter. FIGS. 23, 25, 27, and 29 are sections along the corresponding lines of FIGS. 22, 24, 26, 28.

Tapered sides are presently optional but preferred.

Figure 1:
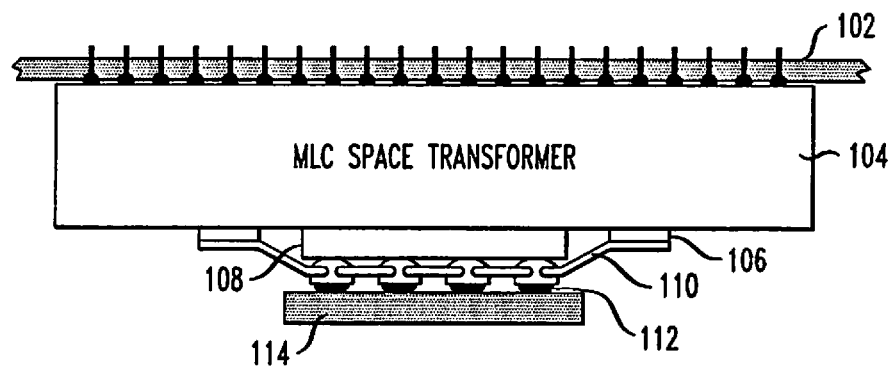
FIG. 1 depicts a thin film interposer probe in accordance with the prior art.
Figure 30:
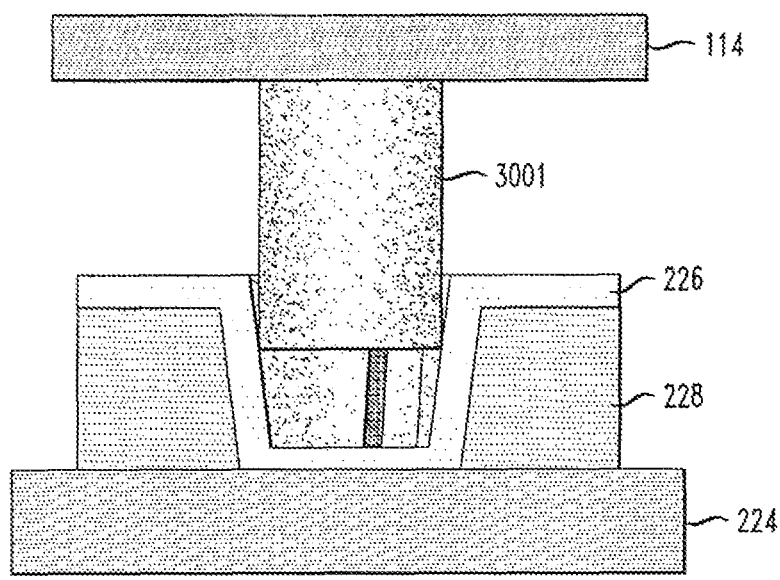
FIG. 30 shows an embodiment with a copper stud.

The second electrical contact can be, for example, a C4 solder bump 112, a micro bump, a copper stud, an interconnect, or any kind of electrically conductive bump. The bumps illustrated in FIGS. 1-3 are generally illustrative of C4 bumps, micro bumps, and electrically conductive bumps in general. FIG. 30 shows a case where the second electrical contact is a copper stud 3001.

The elastomeric pad 228 can be made from any one or more of the following materials: a photo lithographic patternable material, a silicone based elastomer, a dry etching patternable material, and in general, any machine-able and/or moldable material with Young's modulus less than any of the values in the table, depending on the embodiment. In some instances, such materials may have conducting properties themselves or may have conductive material embedded therein.

The first electrical contact can be provided as a conductive layer on the elastomeric pad; for example, using any one or more of the following materials: copper, nickel, silver, gold, aluminum, titanium, titanium-tungsten, Palladium-Cobalt, Solder material (lead free and leaded), Silicide, Beryllium-cobalt, Cu—Ni—Si. Any appropriate metal can be employed.

As seen, for example, in FIGS. 2, 5, and 6, a plurality of the first electrical contacts and elastomeric pads can be provided in a pattern, with a pitch range of, for example, between 15 microns to 400 microns.

The elastomeric pad may bear on the first electrical contact by surrounding same, as in the "depression' embodiments of FIGS. 2-5 and 16-29. In the "cantilever" embodiment of FIG. 6, the elastomeric pad bears on the first electrical contact from underneath the first electrical contact. The cantilever embodiment could also be provided with any of the depression structures depicted herein; for example, depressions formed in portion 660.

The depression may be provided with an edge (e.g., 399 as in FIG. 3) that breaks the oxide layer (which is a less conducting layer) on the second electrical contact when a normal force is applied.

The sides of the depression may have one or more openings, such as slits 440. The same advantageously permit greater lateral movement of the first electrical contact and/or reduce stress on the first electrical contact. A variety of different types of depression may be equipped with slits, regardless of whether the sides of the depression are tapered. See, for example, FIGS. 22 and 26. Although not show in the figures, slits could also or alternatively be formed at the corners 2289.

As noted, in some instances, the dimensions of the top opening of the depression can greater than the dimension of the base of the depression, as in FIGS. 16-18 and 22-25, for example.

Figure 31:
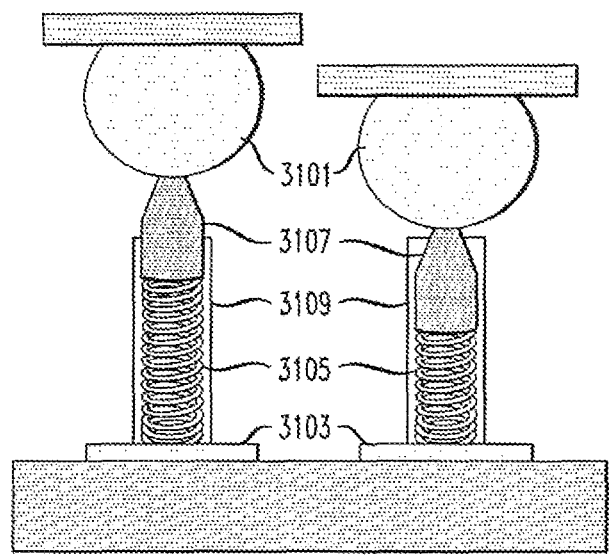
FIG. 31 shows a pogo pin embodiment.

Connections as just described can be formed into an array of connections with a suitable pitch there-between. In some instances, the pitch is up to 400 microns. In some cases, the pitch is between 15 microns to 400 microns. Such arrays may be used, for example, as a test probe; a socket module; a chip module; and/or a pogo pin. FIG. 31 shows a pogo pin aspect. Note C4 3101, pads 3103, springs 3105, spring-loaded pins 3107 in sleeves 3109, forming the pogo pins. A socket may comprise an array of pogo pins and pads.

In some instances, where the first pattern array (array of first contacts) contacts the second pattern array (array of second contacts) permanently when there is an applied normal force holding the first and second arrays together. In some cases, the first pattern array contacts the second pattern array intermittently multiple times and an applied normal force causing the contact between the first pattern and the second patter is less than 30 grams (force) per pad.

In another aspect, with reference to FIG. 6, in general terms, an array of electrical connections includes a first pattern array with a plurality of first electrical contacts 626 made of electrically conductive material, the first electrical contacts comprising cantilevers, and at least one elastomeric pad 628 (e.g., one for each cantilever or one large pad supporting all, or some combination), having a Young's modulus of less than 290,000 psi, which supports the plurality of first contacts. Also included is a second pattern array (not shown in FIG. 6) comprising a plurality of second electrical contacts, made of electrically conductive material, which contact corresponding ones of the first electrical contacts. A pitch exists between any two of the connections in the array. In some instances, a plurality of contact pads 660 are formed on the cantilevers and positioned to contact the second electrical contacts. As noted, depressions may be provided, for example, on pads 660 or directly on cantilevers 626. Further, different upper limits of Young's modulus, as per the table, can be used in different embodiments.

In another aspect, an array of connections as described herein, in combination with a chip or portion of a wafer corresponding to a chip, as well as test equipment, is also contemplated. Furthermore, a method of use comprising providing an array of connections as described herein and using same to interconnect a chip to be tested, or a portion of a wafer corresponding to a chip to be tested, with test equipment, is also contemplated, as is use as any one or more of a test probe; a socket module; a chip module; and/or a pogo pin.

The methods described above can be used in the testing of integrated circuit chips. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end or consumer electronic applications to advanced computer products, having a display, a keyboard or other input device, and a central processor. The techniques set forth herein can be used for testing chips and/or wafers with multiple chips thereon.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An array of electrical connections comprising:
   a first substrate comprising a first array of contacts, the first array of contacts comprising:
      a deformable pad disposed on a first surface of the first substrate, wherein the deformable pad comprises a plurality of recessed depressions formed in the deformable pad, wherein the deformable pad is formed of a deformable material;

a plurality of first recessed electrical contacts formed in the recessed depressions of the deformable pad, respectively, wherein the first recessed electrical contacts are formed of an electrically conductive material that lines sidewall and bottom surfaces of each of the recessed depressions of the deformable pad; and a plurality of conductive vias formed in the first substrate in direct contact with the first recessed electrical contacts, respectively; and a second substrate comprising a second array of contacts, the second array of contacts comprising a plurality of second electrical contacts;

wherein the first substrate and the second substrate are mounted to each other with the second array of contacts aligned to the first array of contacts and with the second electrical contacts in direct contact with the first recessed electrical contacts; and wherein when the first substrate and the second substrate are mounted to each other, the deformable pad is configured to at least partially cause at least one lateral force on the first recessed electrical contacts, so as to induce the first recessed electrical contacts to make electrical contact with the second electrical contacts.

2. The array of electrical connections of claim 1, wherein a pitch between adjacent contacts of the first array of contacts 400 microns or less.

3. The array of electrical connections of claim 1, wherein a pitch between adjacent contacts of the first array of contacts is between 15 microns and 400microns.

4. The array of electrical connections of claim 1., wherein at least one of the first recessed electrical contacts comprises a tapered sidewall.

5. The array of electrical connections of claim 1, wherein at least one of the first recessed electrical contacts comprises a non-tapered sidewall.

6. The array of electrical connections of claim 1, wherein at least one of the first recessed electrical contacts comprises a slit formed in a sidewall of the first recessed electrical contact.

7. The array of electrical connections of claim 1, wherein the deformable material comprises a material having a Young's modulus of less than 1,000,000 psi.

8. The array of electrical connections of claim 1, wherein the deformable material comprises polyimide.

9. The array of electrical connections of claim 1. wherein the deformable material comprises a cured photoresist material.

10. The array of electrical connections of claim 1, wherein the second electrical contacts comprise solder bumps.

11. An array of electrical connections comprising:

a first substrate comprising a first array of contacts, the first array of contacts comprising:

a plurality of deformable pads disposed on a first surface of the first substrate, wherein each deformable pad includes a recessed depression formed in the deformable pad, wherein the deformable pads are formed of a deformable material;

a plurality of first recessed electrical contacts formed in the recessed depressions of the deformable pads, respectively, wherein the first recessed electrical contacts are formed of an electrically conductive material that lines sidewall and bottom surfaces of each of the recessed depressions of the deformable pads; and a plurality of conductive vias formed in the first substrate in direct contact with the first recessed electrical contacts, respectively; and a second substrate comprising a second array of contacts, the second array of contacts comprising a plurality of second electrical contacts;

wherein the first substrate and the second substrate are mounted to each other with the second array of contacts aligned to the first array of contacts and with the second electrical contacts in direct contact with the first recessed electrical contacts; and wherein when the first substrate and the second substrate are mounted to each other, the deformable pads are configured to at least partially cause at least one lateral force on the first recessed electrical contacts, so as to induce the first recessed electrical contacts to make electrical contact with the second electrical contacts.

12. The array of electrical connections of claim 11, wherein a pitch between adjacent contacts of the first array of contacts 400 microns or less.

13. The array of electrical connections of claim 11, wherein a pitch between adjacent contacts of the first array of contacts is between 15 microns and 400 microns.

14. The array of electrical connections of claim 11, wherein at least one of the first recessed electrical contacts comprises a tapered sidewall.

15. The array of electrical connections of claim 11, wherein at least one of the first recessed electrical contacts comprises a non-tapered sidewall.

16. The array of electrical connections of claim 11, wherein at least one of the first recessed electrical contacts comprises a slit formed in a sidewall of the first recessed electrical contact.

17. The array of electrical connections of claim 11, wherein the deformable material comprises a material having a Young's modulus of less than 1,000,000 psi.

18. The array of electrical connections of claim 11, wherein the deformable material comprises polyimide.

19. The array of electrical connections of claim 11, wherein the deformable material comprises a cured photoresist material.

20. The array of electrical connections of claim 11, wherein the second electrical contacts comprise solder bumps.

* * * * *